United States Patent [19]
Yamazaki et al.

[11] Patent Number: 5,583,879
[45] Date of Patent: Dec. 10, 1996

[54] GALLUM NITRIDE GROUP COMPOUND SEMICONDUCTOR LASER DIODE

[75] Inventors: Shiro Yamazaki; Norikatsu Koide; Katsuhide Manabe, all of Aichi-ken; Isamu Akasaki, 38-805, 1 ban, Joshin 1-chome, Nishi-ku, Nagoya-shi, Aichi-ken 451; Hiroshi Amano, 508, 2-104, Yamanote, Meitou-ku, Nagoya-shi, Aichi-ken 465, all of Japan

[73] Assignees: Toyoda Gosei Co., Ltd.; Research Development; Isamu Akasaki; Hiroshi Amano, all of Japan

[21] Appl. No.: 423,946

[22] Filed: Apr. 19, 1995

[30] Foreign Application Priority Data

Apr. 20, 1994 [JP] Japan ..................... 6-106055
Apr. 20, 1994 [JP] Japan ..................... 6-106056

[51] Int. Cl.⁶ .................. H01S 3/18; H01L 3/00
[52] U.S. Cl. .................. 372/45; 257/103
[58] Field of Search ................ 372/43, 44, 45; 257/103

[56] References Cited

U.S. PATENT DOCUMENTS

| 4,903,088 | 2/1990 | Van Opdorp | 372/43 |
| 5,247,533 | 9/1993 | Okazaki et al. | 372/45 |
| 5,321,713 | 6/1994 | Khan et al. | 372/45 |

FOREIGN PATENT DOCUMENTS 0599224  6/1994  European Pat. Off. .
6-283825  7/1994  Japan ..................... 372/45
6268259  9/1994  Japan .

OTHER PUBLICATIONS

Nakamura, S et al., "Candela-class high-brightness InGaN/AlGaN...", Appl. Phys. Lett. 64(12) Mar. 28, 1994, pp. 1687-89.
Amano et al, "Room-Temperature Low-Threshold Surface-Stimulated Emission by Optical Pumping From Al Ga N/GaN Double Heterostructure", Japanese J. of Applied Physics, 32(1993) 15 Jul., No. 7b, Part 2, pp. L1000–L1002.
Akasaki et al, "Perspective of the UV/Blue Light Emitting Devices Based on GaN and Related Compounds", Optoelectronics Devices & Tech., 7(1992) Jun., No. 1, pp. 49–56.
Nakamura et al, "Thermal Annealing Effects on P-type Mg-doped GaN Films", Japanese J. of Applied Physics, 31(1992)Feb., No.2B, Part 2, pp. L139–L142.

Primary Examiner—Rodney B. Bovernick
Assistant Examiner—Robert McNutt
Attorney, Agent, or Firm—Cushman Darby & Cushman IP Group of Pillsbury Madison & Sutro, L.L.P.

[57] ABSTRACT

A gallium nitride group compound semiconductor laser diode (10) satisfying the formula $(Al_xGa_{1-x})_yIn_{1-y}N$, inclusive of $0 \leq x \leq 1$ and $0 \leq y \leq 1$ comprises by a double heterojunction structure sandwiching an active layer (5) between layers (4, 6) having wider band gaps than the active layer (5). The active layer (5) may comprise magnesium (Mg) doped p-type conductive gallium nitride group compound semiconductor satisfying the formula $(Al_xGa_{1-x})_yIn_{1-y}N$, inclusive of $0 \leq x \leq 1$ and $0 \leq y \leq 1$. In another embodiment, the active layer (5) is doped with silicon (Si).

7 Claims, 1 Drawing Sheet

GALLIUM NITRIDE GROUP COMPOUND SEMICONDUCTOR LASER DIODE

BACKGROUND OF THE INVENTION

1. Field of the invention

The present invention relates to a semiconductor laser diode (laser diode hereinafter) that emits visible short wave rays in the blue to violet and also in the ultraviolet regions. Especially, the invention relates to a laser diode which requires a lower threshold current for oscillation.

2. Description of the Prior Art

A conventional laser diode disclosed in U.S. Pat. No. 5,247,533 comprises a gallium nitride group compound semiconductor satisfying the formula $(Al_xGa_{1-x})_yIn_{1-y}N$ inclusive of $0 \leq x \leq 1$ and $0 \leq y \leq 1$, and an active layer not doped with any impurities. Consequently, the laser diode has a problem in that it requires high threshold current for oscillation.

SUMMARY OF THE INVENTION

An object of the present invention is to reduce the threshold current for oscillation.

According to a first aspect of the invention, a semiconductor laser diode is provided which comprises a semiconductor satisfying the formula $(Al_xGa_{1-x})_yIn_{1-y}N$, inclusive of $0 \leq x \leq 1$ and $0 \leq y \leq 1$. The laser diode comprises:

a double hetero-junction structure sandwiching an active layer between layers having wider band gaps than a band gap of said active layer. The active layer comprises a magnesium (Mg)-doped-p-type conductive gallium nitride group compound semiconductor satisfying the formula $(Al_xGa_{1-x})_yIn_{1-y}N$, inclusive of $0 \leq x \leq 1$ and $0 \leq y \leq 1$.

According to a second aspect of the invention, the p-type conductive gallium nitride group compound semiconductor is obtained by one or more of electron irradiation, laser irradiation, and heat treatment.

According to a third aspect of the invention, the p-type conductive gallium nitride group compound semiconductor is obtained by heat treatment in the atmosphere of nitrogen ($N_2$) gases under plasma state.

According to a fourth aspect of the invention, the active layer comprises a silicon (Si) doped n-type conductive gallium nitride compound semiconductor satisfying the formula $(Al_xGa_{1-x})_yIn_{1-y}N$ inclusive of $0 \leq x \leq 1$ and $0 \leq y \leq 1$.

When the active layer comprises a Mg-doped GaN compound of the p-type satisfying the formula $(Al_xGa_{1-x})_yIn_{1-y}N$ inclusive of $0 \leq x \leq 1$ and $0 \leq y \leq 1$, emission efficiency between bands is enhanced resulting in a lower threshold current for oscillation.

When the active layer comprises a Si-doped GaN compound of the n-type satisfying the formula $(Al_xGa_{1-x})_yIn_{1-y}N$ inclusive of $0 \leq x \leq 1$ and $0 \leq y \leq 1$, emission efficiency of the active layer is improved resulting in a lower threshold current for oscillation.

Other objects, features, and characteristics of the present invention will become apparent upon consideration of the following description and the appended claims with reference to the accompanying drawings, all of which form a part of the specification, and wherein like reference numerals designate corresponding parts in the various figures.

DETAILED DESCRIPTION OF THE EXEMPLARY EMBODIMENTS

The invention will be more fully understood by reference to the following examples.

EXAMPLE 1

Figure 1:
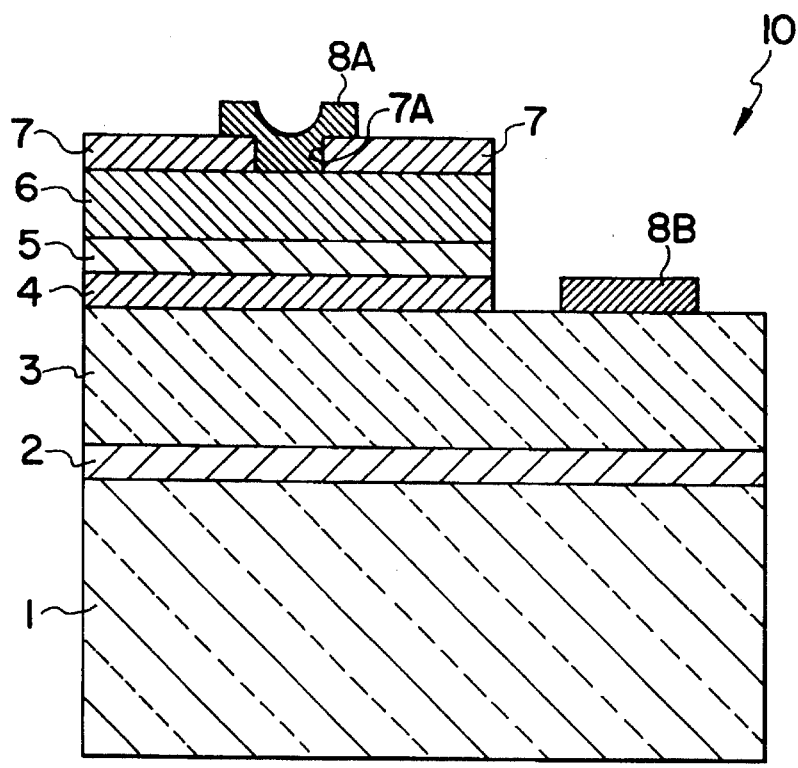
FIG. 1 is a diagram showing the structure of a laser diode embodied in Example 1.

FIG. 1 is a sectional view of a laser diode 10 with a sapphire substrate 1 embodied in Example 1.

Sapphire substrate 1 of single crystalline, and has a main surface "c" (0001) which was cleaned by an organic washing solvent and heat treatment. It placed on a susceptor in a reaction chamber for MOVPE treatment. After the chamber was evacuated, the sapphire substrate 1 was etched at 1200° C. by a vapor of $H_2$ fed into the chamber under normal pressure. As a result, hydrocarbon group gases previously attached to the surface of the sapphire substrate 1 were removed to some extent.

About a 50 nm thick aluminum nitride (AlN) buffer layer 2 was epitaxially formed on the sapphire substrate 1 under conditions of lowering the temperature of the sapphire substrate 1 to 400° C., keeping the temperature constant, and supplying trimethyl aluminum ($Al(CH_3)_3$) (TMA hereinafter) and ammonia ($NH_3$).

On the buffer layer 2, a silicon (Si) doped GaN $n^+$-layer 3 of high carrier concentration was formed under conditions of raising the temperature of the sapphire substrate 1 to 1150° C., stopping supplying only TMA, and additionally supplying trimethyl gallium ($Ga(CH_3)_3$) (TMG hereinafter), and silane ($SiH_4$).

The wafer was taken out from the chamber to cover a portion of GaN layer 3 with a silicon oxide ($SiO_2$) mask, and returned into the chamber. The chamber was evacuated again and supplied with hydrogen ($H_2$) and $NH_3$ raising the temperature of the sapphire substrate 1 to 1150° C.

Then, about a 0.5 μm thick undoped $Al_{0.1}Ga_{0.9}N$ n-layer 4 was formed on the portion of the $n^+$-layer 3 which was not covered with $SiO_2$ by supplying TMA and TMG.

About a 0.4 μm thick magnesium (Mg) doped GaN active layer 5 was formed on the n-layer 4 by supplying TMG and biscyclopentadienyl magnesium ($Mg(CH_5H_5)_2$) ($CP_2Mg$ hereinafter).

About 0.5 μm thick Mg-doped $Al_{0.1}Ga_{0.9}N$ p-layer 6 was formed on the active layer 5 by supplying TMA, TMG, and $CP_2Mg$.

Then, the $SiO_2$ layer covering the portion of the $n^+$-layer 3 as a mask was removed by a hydrofluoric acid group etching liquid.

After a $SiO_2$ layer 7 was formed on the p-layer 6, a strip-like window 7A of 1 mm by 50 μm in dimensions was formed. Then, the wafer was transferred into a vacuum chamber, and electron rays were irradiated into the Mg-doped p-layer 6 and the Mg-doped active layer 5. This irradiation changed those layers 5 and 6 into p-type conductive layers.

Typical irradiation conditions are:

15 KV for the electron accelerating voltage;
120 μA for the emission current;
60 μmφ for the electron spot diameter; and 297 K for the sample temperature.

Subsequently, a metal electrode 8A was formed in strip-like window 7A, and a metal electrode 8B was formed on GaN n$^+$-layer 3.

The obtained laser diode 10 was found to require 90% less threshold current for oscillation than a conventional laser diode whose GaN active layer was not doped with any impurities.

EXAMPLE 2

Figure 2:
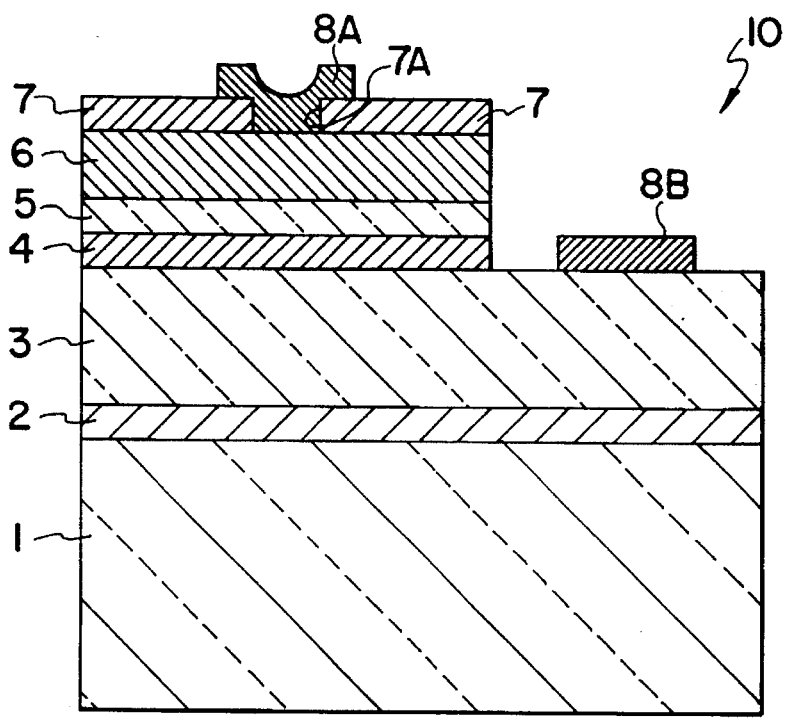
FIG. 2 is a diagram showing the structure of a laser diode embodied in Example 2.

FIG. 2 is a sectional view illustrating the structure of a semiconductor laser diode with a sapphire substrate in Example 2. A difference between Examples 1 and 2 resides in active layer 5. In example 2, active layer 5 is doped with silicon (Si), although active layer 5 in Example 1 is doped with magnesium (Mg) and is irradiated with electron beams for p-type conduction. The manufacturing process used in Example 2 up to formation of AlGaN n-layer 4 was the same as the process described in Example 1.

On n-layer 4, about a 0.4 μm thick Si-doped GaN active layer 5 was formed by supplying TMG and SiH$_4$.

Subsequently, an Al$_{0.1}$Ga$_{0.9}$N p-layer 6 and metal electrodes 8A and 8B were formed by the same processes that were described in Example 1. Electron irradiation was carried out only onto Mg-doped p-layer 6 under the same conditions as those described in Example 1.

The obtained laser diode 10 was found to require 90% less threshold current for oscillation than a conventional laser diode whose GaN emission layer was not doped with any impurities.

Although sapphire was employed as the substrate in Examples 1 and 2, an alternative substrate can be used, such as a silicon substrate, a 6H-SiC substrate, or a GaN substrate.

One or more of electron irradiation, laser irradiation, and heat treatment can be used although electron irradiation was employed for the p-type conductive layers 5 and 6 in Example 1 and for the p-layer 6 in Example 2.

The p-type conductive layers were alternatively obtained by heat treatment in the atmosphere of nitrogen (N$_2$) gases in a plasma state as described in the following processes.

The reaction chamber was evacuated, and then N$_2$ gases were introduced into the chamber keeping the pressure of the chamber at 100 Torr or less. After plasma discharge was carried out in the chamber at an electric power of 10 to 100 W, heat treatment was carried out onto the substrate 2 for 5 to 60 min. keeping its temperature 500° to 900° C. This discharge can be carried out with any one of high-frequency wave, microwave, direct current, and so on, alternatively. The substrate 2 was placed in either a state of plasma discharge, in which both N radical species and ionized species existed, or in a state of afterglow, in which only N radical species existed. The optimum conditions for the p-type conductive layers with fine crystallinity were 750° C. temperature of the sapphire substrate 1 and 40 W of electric power.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A gallium nitride group compound semiconductor laser diode satisfying the formula (Al$_x$Ga$_{1-x}$)$_y$In$_{1-y}$N, inclusive of $0 \leq X \leq 1$ and $0 \leq y \leq 1$ comprising:

a double hetero-junction structure sandwiching an active layer between layers having wider band gaps than said active layer wherein said active layer comprises a magnesium (Mg)-doped p-type conductive gallium nitride group compound semiconductor satisfying the formula (Al$_x$Ga$_{1-x}$)$_y$In$_{1-y}$N, inclusive of $0 \leq X \leq 1$ and $0 \leq y \leq 1$.

2. The semiconductor laser diode according to claim 1, wherein said active layer is formed over a structure including a substrate, a buffer layer, an n$^+$-layer, and an n-layer.

3. The semiconductor laser diode according to claim 1, wherein said active layer comprises a layer modified to be a p-type semiconductor by performing one or more of electron irradiation, laser irradiation, and heat treatment on a magnesium (Mg)-doped layer.

4. The semiconductor laser diode according to claim 1, wherein said active layer comprises a layer modified to be a p-type semiconductor by performing heat treatment to a magnesium (Mg)-doped layer in an atmosphere of nitrogen (N$_2$) under a plasma state.

5. A gallium nitride group compound semiconductor laser diode satisfying the formula (Al$_x$Ga$_{1-x}$)$_y$In$_{1-y}$N, inclusive of $0 \leq X \leq 1$ and $0 \leq y \leq 1$ comprising:

a double hetero-junction structure sandwiching an active layer between layers having wider band gaps than said active layer wherein said active layer comprises a silicon (Si)-doped n-type conductive gallium nitride group compound semiconductor satisfying the formula (Al$_x$Ga$_{1-x}$)$_y$In$_{1-y}$N, inclusive of $0 \leq X \leq 1$ and $0 \leq y \leq 1$.

6. The semiconductor laser diode according to claim 5, wherein said active layer comprises a layer modified to be a p-type semiconductor by performing one or more of electron irradiation, laser irradiation and heat treatment on a silicon (Si)-doped layer.

7. The semiconductor laser diode according to claim 5, wherein said active layer comprises a layer modified to be a p-type semiconductor by performing heat treatment to a silicon (Si)-doped layer in an atmosphere of nitrogen (N$_2$) under a plasma state.

\* \* \* \* \*